(12) United States Patent
Wang et al.

(10) Patent No.: US 8,232,563 B2
(45) Date of Patent: Jul. 31, 2012

(54) LIGHT-EMITTING DEVICE

(75) Inventors: Chien-Yuan Wang, Hsinchu (TW);
Min-Hsun Hsieh, Hsinchu (TW);
Yu-Jiun Shen, Hsieh (TW)

(73) Assignee: Epistar Corporation, Hsinchu (TW)

( * ) Notice: Subject to any disclaimer, the term of this patent is extended or adjusted under 35 U.S.C. 154(b) by 841 days.

(21) Appl. No.: 11/808,963

(22) Filed: Jun. 14, 2007

(65) Prior Publication Data

US 2008/0308818 A1 Dec. 18, 2008

(51) Int. Cl.
*H01L 33/00* (2010.01)
(52) U.S. Cl. ............... 257/88; 257/98; 257/E33.061
(58) Field of Classification Search ............... 257/88, 257/89, 98, 100, E33.061; 362/800, 249.02, 362/545, 555, 612–614
See application file for complete search history.

(56) References Cited

U.S. PATENT DOCUMENTS

| 6,395,564 | B1 * | 5/2002 | Huang ................................ 438/7 |
| 6,504,180 | B1 * | 1/2003 | Heremans et al. ............... 257/98 |
| 7,498,734 | B2 | 3/2009 | Suehiro et al. |
| 2004/0135504 | A1 * | 7/2004 | Tamaki et al. ................. 313/512 |
| 2005/0135079 | A1 * | 6/2005 | Yin Chua et al. ............... 362/12 |
| 2006/0284195 | A1 * | 12/2006 | Nagai ............... 257/98 |
| 2007/0111344 | A1 * | 5/2007 | Leising ........................ 438/22 |

FOREIGN PATENT DOCUMENTS

| CN | 1574407 A | 2/2005 |
| WO | WO 2006098450 | 9/2006 |

* cited by examiner

*Primary Examiner* — Minh-Loan T Tran
*Assistant Examiner* — Leslie Pilar Cruz
(74) *Attorney, Agent, or Firm* — Bacon & Thomas, PLLC

(57) ABSTRACT

A light-emitting device includes an LED chip emitting a primary light, and a phosphor deposited on the LED chip for absorbing the primary light to excite a secondary light, wherein the wavelength of the primary light is shorter than 430 nm and the LED chip is driven by current density greater than 200 mA/cm$^2$. The wavelength-converting light-emitting device has a high light efficiency and a stable color temperature, wherein LED chip is diced from a wafer made by means of a phosphor-on-chip process.

13 Claims, 5 Drawing Sheets

700

LIGHT-EMITTING DEVICE

TECHNICAL FIELD

This invention relates to a light-emitting device, and more particularly to a wavelength-converting light-emitting diode device that produces white light when driven by high current density.

BACKGROUND

Light-emitting diode (LED) devices are useful because they have lower power consumption, long-term durability and lower cost, comparing with conventional incandescent and fluorescent lamps. Therefore, LED devices are widely used in various fields such as displays, traffic lights, data storage apparatus, communication apparatus, lighting apparatus, and medical apparatus.

With the development of high efficiency LEDs that emit blue or ultraviolet (UV) light, it has become feasible to produce a white LED device with a wavelength-converting method. A portion of the primary light emitted from such an LED is converted into the secondary light with a longer wavelength by phosphor. Conversion of the primary light of the LED to a longer wavelength is commonly referred to as "down-conversion" of the primary light. At least a portion of the secondary light combines with the unconverted portion of the primary light to produce white light.

Therefore, various attempts have been made to generate white light by using blue LEDs or UV LEDs. A prior art technology involves ultraviolet (UV) light at a wavelength of about 390 nm, emitted from an LED and converted by red, green, and blue phosphors to create white light. The disadvantage of the UV-phosphor white light system lies in its low durability.

Another prior art technology involves a white light generating system composed of a blue LED, which emits light having a wavelength between 450~470 nm, together with YAG:Ce phosphor. The system produces white light of a high color temperature ranging from 6000 K to 8000 K, which is comparable to sunlight, and a typical color rendering index (CRI) of about 70 to 75. However, the conventional system has problems such as the large deviation of color temperatures, and the unstable quantum efficiency of the blue LED which decreases rapidly when driven by high current density. Since there is a large deviation of the color temperatures of the LEDs in a wafer, an additional chip sorting process after dicing is necessary for the chips to provide white light LED devices with a stable color temperature, and thereby increases the cost. Another prior art technology involves a lamp that contains at least three LED chips—red, green, and blue chips, encapsulated in a single epoxy package. The chips are powered via at least four electrical leads. The multiple-chip device is complicated and the cost is higher than other white light illumination apparatus.

In view of the above-mentioned, improved light efficiency and color quality is desirable for white light illumination.

SUMMARY OF THE INVENTION

The present invention provides a wavelength-converting light-emitting device which comprises an LED chip that emits a primary light, and a wavelength-converting material above the LED chip for absorbing the primary light to excite a secondary light, wherein the wavelength of the primary light is shorter than 430 nm and the LED chip is driven by current density greater than 200 mA/cm$^2$. Preferably, the wavelength of the primary light is between 410 nm to 425 nm and the driving current density is greater than 350 mA/cm$^2$. According to the present invention, the efficiency of the wavelength-converting light-emitting device is improved.

In accordance with another feature of the invention, the wavelength-converting light-emitting device is made by a phosphor-on-chip process comprising the steps of: Step 1—forming a light-emitting stacked layer on a wafer; Step 2—depositing a phosphor thin film on the light-emitting stacked layer; Step 3—dicing the wafer into LED chips; Step 4—encapsulating the LED chips into LED devices by resin. The LED chips in a wafer have different wavelengths between 410 nm~425 nm by means of the above process, and the color temperatures of at least two of the LED devices in a wafer are about the same.

Other features and advantages of the present invention and variations thereof will become apparent from the following description, drawing and claims.

DETAILED DESCRIPTION OF PREFERRED EMBODIMENTS

Figure 1:
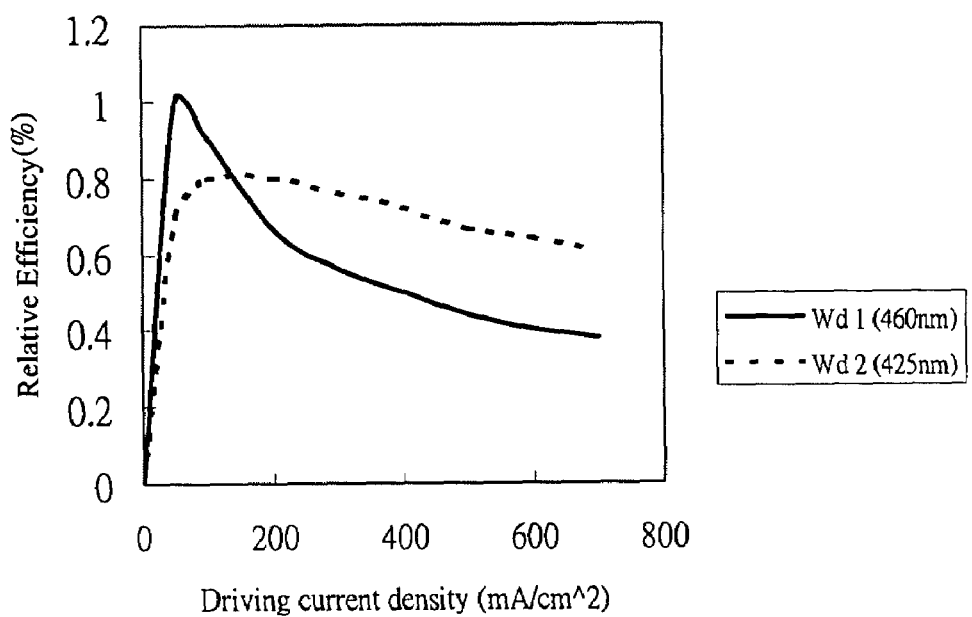
FIG. 1 is a diagram showing the relationship between relative efficiency and driving current density of the LEDs with different emission wavelengths.

FIG. 1 is a diagram showing the relationship between relative efficiency and driving current density for the LEDs with different emission wavelengths. The Wd1 represents the emission wavelength of 460 nm of the LED and shows the external quantum efficiency (EQE) drops quickly when the driving current density of the driving current is increased. The Wd2 represents the emission wavelength of 425 nm of the LED and shows the external quantum efficiency (EQE) drops more slowly than Wd1. An LED is composed of a light-emitting stacked structure which comprises an active layer sandwiched between two different types of semiconductor layers for emitting the light. The wavelength of the LED can be tuned from Wd1 (460 nm) to Wd2 (425 nm) by controlling the dopant composition in the active layer of the light-emitting stacked structure. Since the low concentration of dopant in the active layer has superior film quality, it is suitable for a high current density operation.

As shown in FIG. 1, the external quantum efficiency of 425 nm is higher than 460 nm when the driving current density is greater than 200 mA/cm$^2$. In other words, the external quantum efficiency of shorter emission wavelength is higher than the longer emission wavelength when driven with high current density. Therefore, the LED with a shorter emission wavelength is preferred, and the LED with emission wavelength less than 430 nm is better.

Figure 2:
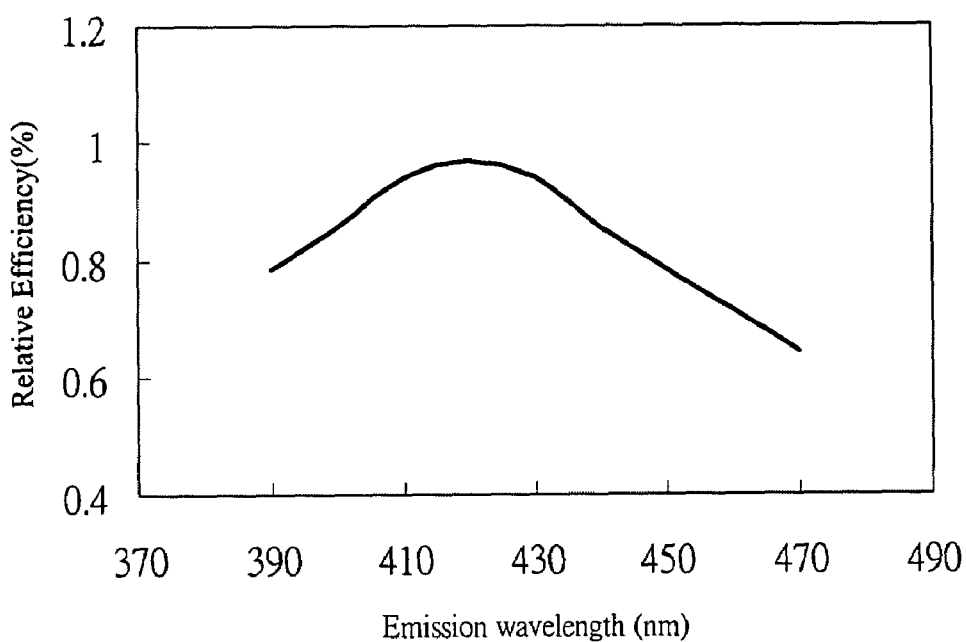
FIG. 2 is a diagram showing the relationship between relative efficiency and emission wavelength of the LED driven by the same current density.
Figure 3:
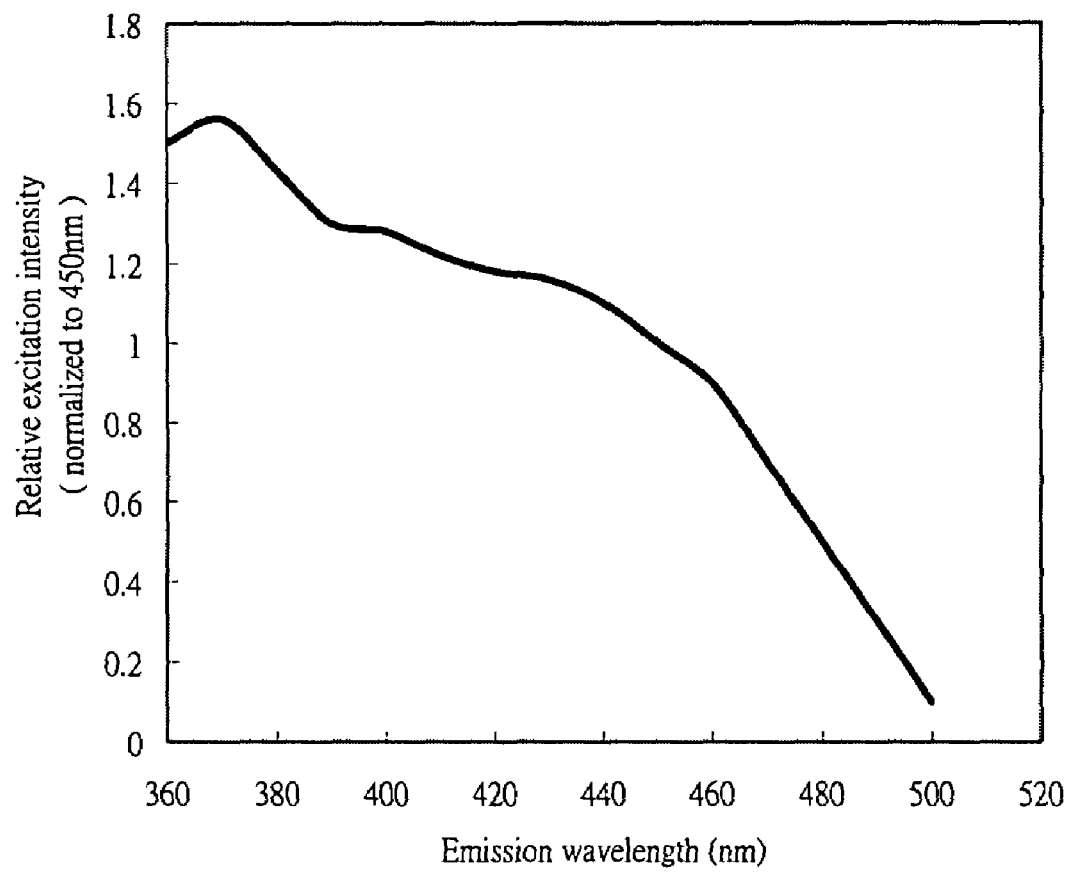
FIG. 3 is a diagram showing the relationship between relative excitation intensity and emission wavelength of the phosphor Ba$_2$SiO$_4$:Eu.

FIG. 2 is a diagram showing the relationship between relative efficiency and emission wavelength of an LED driven by the same current density of 350 mA/cm$^2$. The maximum value of wall-plug efficiency (WPE) occurs in the range of 400 nm~440 nm of emission wavelength. Preferably, this embodiment adopts the shorter emission wavelength in the range of 410 nm~425 nm for higher wall-plug efficiency (WPE). FIG. 3 is a diagram showing the relationship between relative excitation intensity and emission wavelength of LED with the Ba$_2$SiO$_4$:Eu phosphor. The excitation intensity of the Ba$_2$SiO$_4$:Eu phosphor is higher when the emission wavelength is shorter. However, as shown in FIG. 2, when the emission wavelength of LED is shorter than 410 nm, the wall-plug efficiency drops as the wavelength decreases due to the less effective carrier confinement in the active layer.

According to the above description, an embodiment of present invention is a white LED including an InGaN-based LED chip with the emission wavelength of 410~425 nm encapsulated by resin with Ba$_2$SiO$_4$:Eu phosphor. Generally, the phosphor is in a powder form that is mixed into the epoxy prior to curing. The epoxy is for filling the reflector cup in the following processes. The uncured epoxy containing the phosphor powder is then deposited onto the LED chip and subsequently cured. Compared with a conventional white LED with emission wavelength of 450~470 nm, the embodiment of the white LED with the emission wavelength of 410~425 nm has higher light efficiency when driven by current density of 350 mA/cm$^2$ because the external quantum efficiency (EQE), the wall-plug efficiency (WPE) and excitation intensity are higher when driven by higher current density, as shown in FIGS. 1 to 3.

Figure 4:
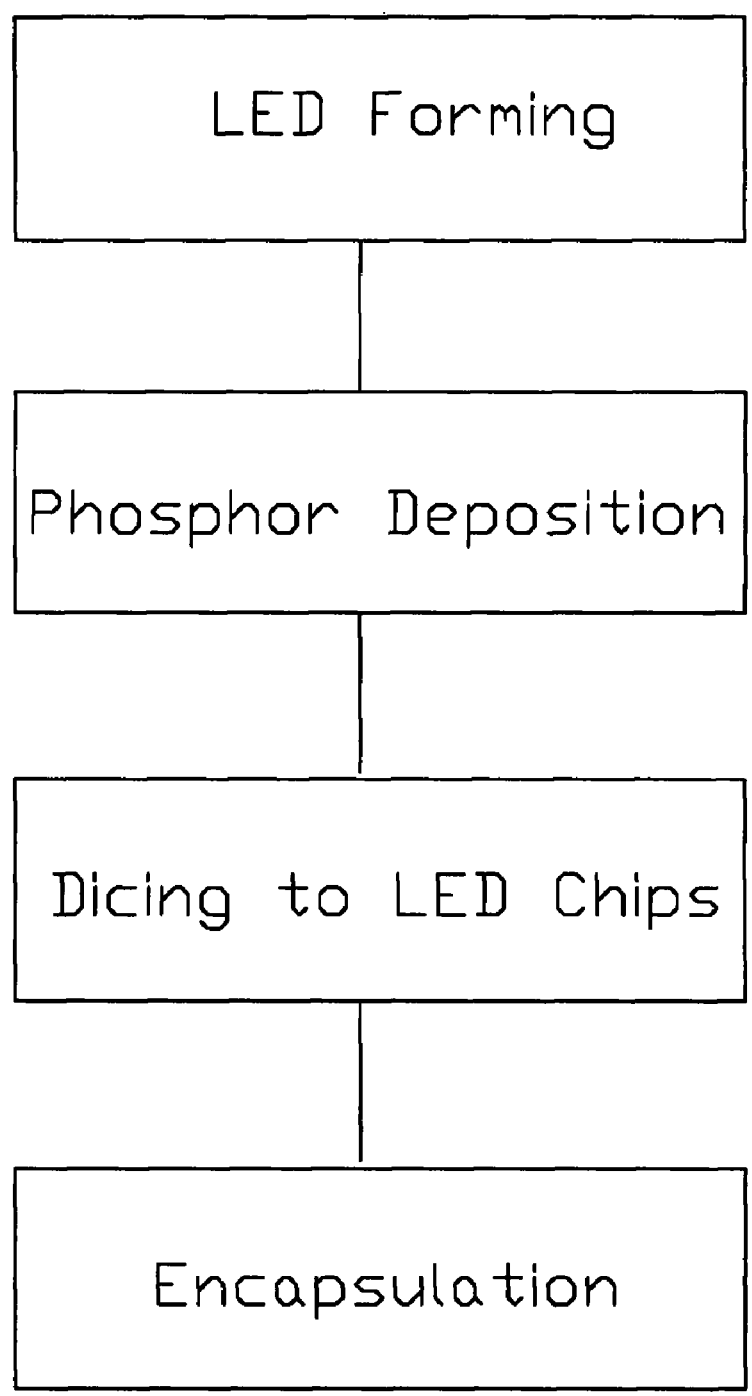
FIG. 4 is a block diagram showing the process flow of phosphor-on-chip process.

Another embodiment of the present invention is a wavelength-converting LED prepared by the phosphor-on-chip process as shown in FIG. 4. The process flow is described as below in details.

Step 1: forming a light-emitting stacked structure with the emission wavelength of 410~425 nm on a wafer.

Step 2: depositing a phosphor thin film on the surface of the light-emitting stacked structure to from a phosphor-coated wafer. Several known techniques may be used for depositing the phosphor thin film. For example, electron beam evaporation, thermal evaporation, RF-sputtering, chemical vapor deposition, or atomic layer epitaxy. The method that is utilized for depositing the thin film may depend on the desired characteristics of the thin film like whether the primary radiation emitted by the light-emitting stack layers is all absorbed or not.

Step 3: dicing the wafer into LED chips.

Step 4: encapsulating each of the LED chips into LED devices with resin.

Figure 5:
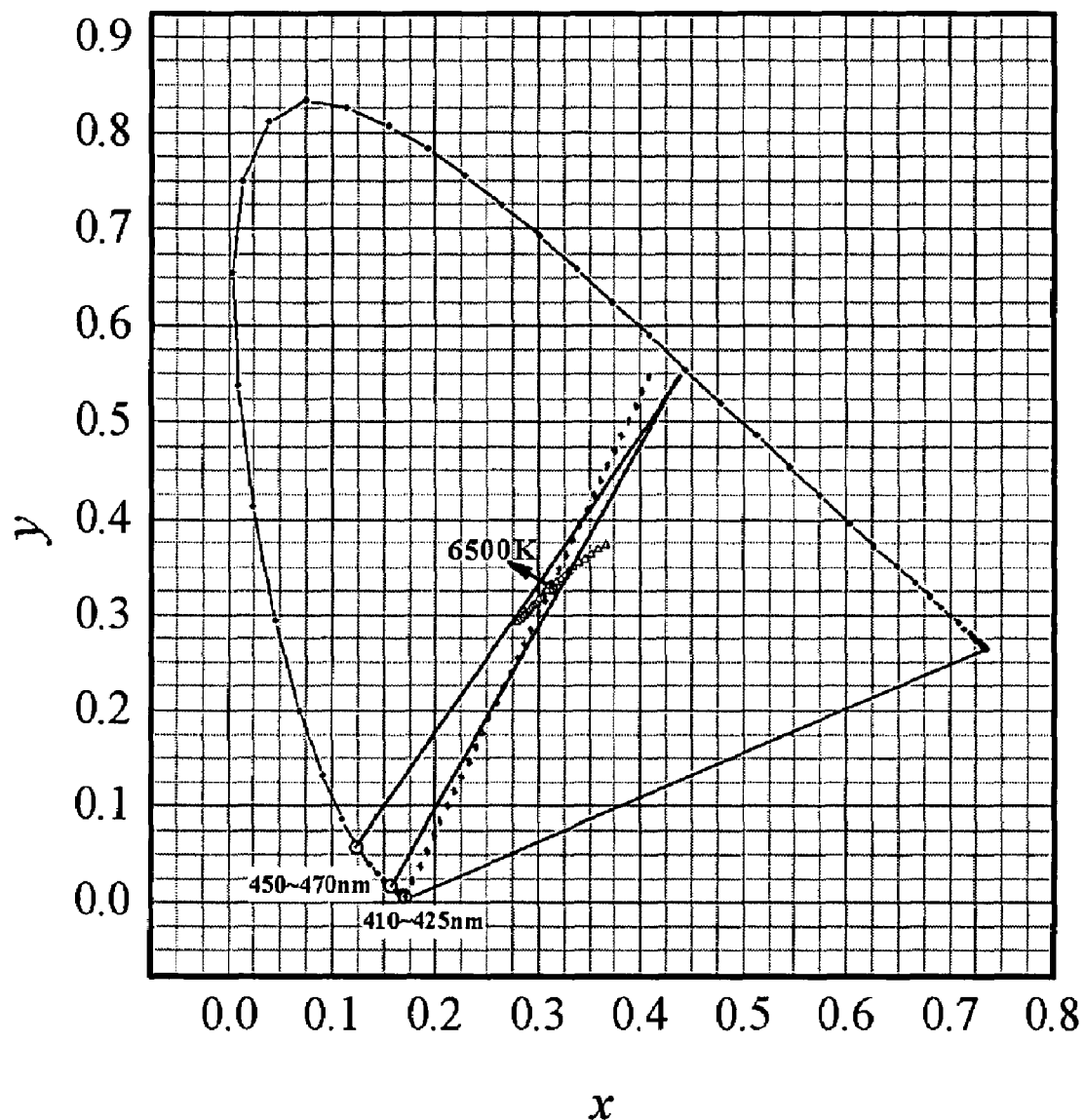
FIG. 5 is a diagram showing the color temperatures of the white LED in different emission wavelengths.

In such a process, the emission wavelengths of the LED chips diced from the same wafer are different and in the range of 410~425 nm. FIG. 5 shows the color temperatures of the white LED devices with the LED chips of the preferred embodiment in different emission wavelengths. The color temperatures of the white LED devices with the LED chips of the preferred embodiment are almost the same (about 6500 K). As to conventional white LED devices, the emission wavelengths of the LED chips therefore are generally between 450-465 nm, and the color temperatures of the conventional white LED devices made by a similar process are generally within 5800 K to 7300 K. Due to the larger deviation of the color temperatures, an additional sorting process step is necessary for the conventional white LED devices. On the contrary, the deviation of the color temperatures of the white LED devices with the LED chips from the same wafer of the preferred embodiment is within 300 K, wherein the chips are of shorter emission wavelength between 410~425 nm with Ba$_2$SiO$_4$:Eu phosphor, so a traditional process for sorting and testing chips can be waived to save the cost and increase the productivity.

The composition of phosphor is selected to determine the wavelength of the excitation light. An additional embodiment of present invention involves selecting a phosphor for generating the white light, green light, red light, orange light, or yellow light and the phosphor is selected from a group consisting of (Sr,Ba)$_2$SiO$_4$:Eu phosphor, oxynitride phosphor, nitride phosphor, etc.

Figure 6:
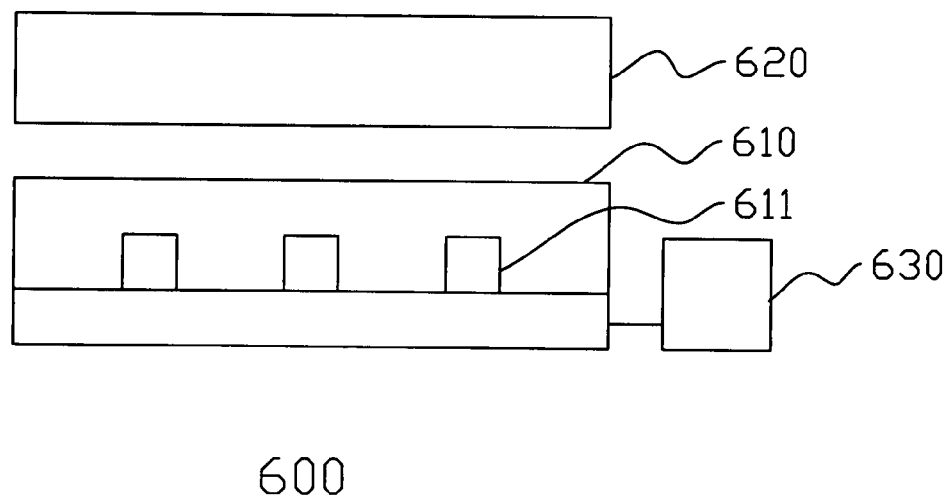
FIG. 6 is a diagram showing a backlight module with an LED light source in accordance with the present invention.

FIG. 6 is a schematic diagram illustrating a backlight module incorporating a white LED device in accordance with an embodiment of the present invention. The white LED device depicted in above embodiments can be employed in a backlight module as shown in FIG. 6. The backlight module 600 includes a light source 610 composed of a white LED device 611 in accordance with any one of the above embodiments, an optical apparatus 620 for processing light emitted form the light source 610, and a power supply system 630 for providing the power to the light source 610.

Figure 7:
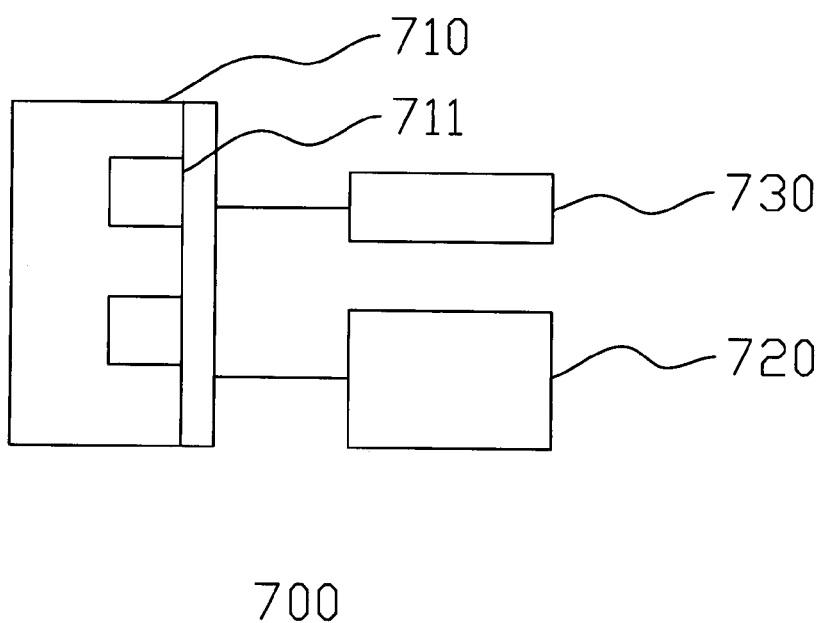
FIG. 7 is a diagram showing a lighting apparatus with an LED light source in accordance with the present invention.

FIG. 7 is a schematic diagram illustrating a lighting apparatus incorporating the white LED device in accordance with an embodiment of present invention. The lighting apparatus 700 may be a streetlamp, car lighting, flashlights, indicator lights, display backlighting, architectural lighting or pilot light, etc. Generally, the lighting apparatus 700 includes a light source 710 comprising an above-mentioned white LED 711, a power supply system 720, and a controller 730 for controlling the power of the power supply system 720 to provide input power to the light source 710.

The foregoing description has been directed to specific embodiments of this invention. It will be apparent, however, that other variations and modifications may be made to the described embodiments, with the attainment of some or all of their advantages. Therefore, it is an object of the appended claims to cover all such variations and modifications that fall within the spirit and scope of the invention.

What is claimed is:

1. A light-emitting device comprising:
   a wafer having a light-emitting stacked structure deposited thereon for emitting a primary light, and
   a wavelength-converting thin film above the light-emitting stacked structure for absorbing the primary light to emit a secondary light,
   wherein a wavelength of the primary light is between 410 nm to 425 nm, and wherein a plurality of chips are diced from the wafer containing the wavelength-converting thin film, and the difference of the color temperatures of at least two of the plurality of chips is less than 300K.

2. A light-emitting device according to claim 1, wherein the secondary light is mixed with the primary light for generating white light, green light, red light, orange light, or yellow light.

3. A light-emitting device according to claim 1, wherein at least one of the chips is driven by a current density greater than 200 mA/cm$^2$.

4. A light-emitting device according to claim 1, wherein the color temperatures of at least two of the plurality of chips are substantially the same.

5. A light-emitting device according to claim 1, wherein the wavelength-converting thin film is deposited by electron beam evaporation, thermal evaporation, RF-sputtering, chemical vapor deposition, or atomic layer epitaxy.

6. A light-emitting device according to claim 1, wherein the primary light is partially converted into the secondary light.

7. A light-emitting device according to claim 1, wherein the wavelength-converting thin film contains a phosphor selected from the group consisting of (Sr,Ba)$_2$SiO$_4$:Eu phosphor, oxynitride phosphor, and nitride phosphor.

8. A light-emitting device of claim 7 wherein the phosphor is a Ba$_2$SiO$_4$:Eu phosphor.

9. A phosphor-coated wafer comprising a light-emitting stacked structure thereon for emitting a primary light and a wavelength-converting thin film above the light-emitting stacked structure, wherein a wavelength of the primary light is between 410 nm to 425 nm and wherein the phosphor-coated wafer can be diced into a plurality of light-emitting devices and the difference of the color temperature among the light-emitting devices is within 300K.

10. A phosphor-coated wafer according to claim 9, wherein the light-emitting devices are driven by a current density greater than 200 mA/cm$^2$.

11. A phosphor-coated wafer according to claim 10, wherein the light-emitting devices are driven by a current density greater than 350 mA/cm$^2$.

12. A phosphor-coated wafer according to claim 9, wherein the wavelength-converting thin film absorbs the primary light to generate a secondary light.

13. A phosphor-coated wafer according to claim 12, wherein the secondary light is mixed with the primary light for generating white light, green light, red light, orange light, or yellow light.

* * * * *